US012727507B2

(12) United States Patent
Xiang et al.

(10) Patent No.: US 12,727,507 B2
(45) Date of Patent: Sep. 1, 2026

(54) SUBSTRATE ENCAPSULATING METHOD, DISPLAY PANEL, AND DISPLAY DEVICE

(71) Applicants: Huizhou China Star Optoelectronics Display Co., Ltd., Huizhou (CN); TCL China Star Optoelectronics Technology Co., Ltd., Shenzhen (CN)

(72) Inventors: Changming Xiang, Huizhou (CN); Weiji Zhang, Huizhou (CN)

(73) Assignee: Huizhou China Star Optoelectronics Display Co., Ltd., Huizhou (CN)

( * ) Notice: Subject to any disclaimer, the term of this patent is extended or adjusted under 35 U.S.C. 154(b) by 241 days.

(21) Appl. No.: 17/610,707

(22) PCT Filed: Sep. 30, 2021

(86) PCT No.: PCT/CN2021/122269
§ 371 (c)(1),
(2) Date: Mar. 23, 2023

(87) PCT Pub. No.: WO2023/039958
PCT Pub. Date: Mar. 23, 2023

(65) Prior Publication Data

US 2024/0038744 A1 Feb. 1, 2024

(30) Foreign Application Priority Data

Sep. 18, 2021 (CN) .......................... 202111111200.0

(51) Int. Cl.
*H10W 90/00* (2026.01)
*H10D 86/01* (2026.01)
(Continued)

(52) U.S. Cl.
CPC ........ *H10W 90/00* (2026.01); *H10D 86/0241* (2025.01); *H10H 20/018* (2025.01); *H10H 20/8506* (2025.01)

(58) Field of Classification Search
CPC ............... H10H 20/018; H10H 20/036; H10H 20/0364; H10H 20/85; H10H 20/8506;
(Continued)

(56) References Cited

U.S. PATENT DOCUMENTS 7,683,538 B2 * 3/2010 Yoo .................... H10K 59/1275
313/506
7,990,060 B2 * 8/2011 Ahn ................... H10K 59/8721
445/25
(Continued)

FOREIGN PATENT DOCUMENTS

CN 107731864 A 2/2018
CN 111540839 A 8/2020
(Continued)

*Primary Examiner* — Mark W Tornow
*Assistant Examiner* — Priya M Rampersaud
(74) *Attorney, Agent, or Firm* — Nathan & Associates Patent Agents Ltd.; Menachem Nathan

(57) ABSTRACT

The present application provides a substrate encapsulating method, a display panel, and a display device. The substrate encapsulating method includes providing a first underlay, and fabricating a switching device on the first underlay to form a switching substrate; providing a second underlay, and fabricating a light-emitting diode on the second underlay to form a light-emitting substrate; applying a frame glue to an edge of the switching substrate or an edge of the light-emitting substrate; and bonding the switching substrate and the light-emitting substrate with the frame glue to seal the light-emitting diode between the switching substrate and the light-emitting substrate.

17 Claims, 4 Drawing Sheets

(51) Int. Cl.
*H10H 20/01* (2025.01)
*H10H 20/85* (2025.01)

(58) Field of Classification Search
CPC ............. H10H 20/857; H10K 59/8722; H10K 50/841; H10K 59/871; H10K 50/8426; G09F 9/33; H10D 86/0241; H10W 90/00
See application file for complete search history.

(56) References Cited

U.S. PATENT DOCUMENTS

2002/0158568 A1* 10/2002 Satake ................. H10K 59/873 313/493
2003/0008970 A1* 1/2003 Rumack ................. C08G 18/12 524/589
2004/0080262 A1* 4/2004 Park ................... H10K 59/1275 313/498
2005/0140282 A1* 6/2005 Park ....................... H10K 59/38 313/506
2006/0061262 A1* 3/2006 Yoo .................... H10K 59/1275 313/506
2008/0012476 A1* 1/2008 Kim ....................... H05B 33/04 313/504
2008/0203904 A1* 8/2008 Kim ..................... H10K 59/127 313/504
2010/0193778 A1* 8/2010 An ......................... H10K 59/12 257/E33.005
2010/0276676 A1* 11/2010 Yamaga .................. G02F 1/167 257/40
2011/0127570 A1 6/2011 Um
2014/0191204 A1* 7/2014 Jeong ..................... H10K 59/38 257/40
2017/0170247 A1* 6/2017 Kim ................... H10K 59/8722
2019/0157523 A1* 5/2019 Hong .................... H10W 90/00

FOREIGN PATENT DOCUMENTS

TW 201203634 A 1/2012
WO 2020155943 A1 8/2020

* cited by examiner

SUBSTRATE ENCAPSULATING METHOD, DISPLAY PANEL, AND DISPLAY DEVICE

CROSS REFERENCE OF RELATED APPLICATION

This application is a US national phase application based upon an International Application No. PCT/CN2021/122269, filed on Sep. 30, 2021, which claims the priority of Chinese Patent Application No. 202111111200.0, entitled "SUBSTRATE ENCAPSULATING METHOD, DISPLAY PANEL, AND DISPLAY DEVICE", filed on Sep. 18, 2021, the disclosure of which is incorporated herein by reference in its entirety.

BACKGROUND OF DISCLOSURE

1. Field of Disclosure

The present application relates to display device technology, and in particular to a substrate encapsulating method, a display panel, and a display device.

2. Description of Related Art

Micro light-emitting diode (LED), mini LED, and other micro-LED display technologies have developed into one of the hot spots of future display technology. Compared with current LCD and organic light-emitting diode (OLED) display devices, micro-LED display technology has advantages of fast response times, high color gamut, high pixel density, and low energy consumption.

Traditional encapsulating of LED first fixes the LED chip on a substrate, and then uses an encapsulant such as silicone to coat the entire surface of the LED chip on the substrate to achieve the encapsulation process. In this kind of LED device formed by the encapsulant encapsulating process, on the one hand, during the encapsulating process, the LED chip may move, causing the position accuracy of the LED chip package to be low, and might also affect conductivity between the LED chip and the substrate, which can easily cause the substrate to short-circuit. On the other hand, a thickness uniformity of the encapsulating glue such as silicone is difficult to control, resulting in poor uniformity of the encapsulating glue, low light transmittance, and poor water and oxygen resistance, thereby affecting the display uniformity.

SUMMARY

The present application provides a substrate encapsulating method, a display panel, and a display device to solve the problem of poor substrate encapsulating effect.

In one aspect, the present application provides a substrate encapsulating method, including:

- providing a first underlay, and fabricating a switching device on the first underlay to form a switching substrate;
- providing a second underlay, and fabricating a light-emitting diode on the second underlay to form a light-emitting substrate;
- applying a frame glue to an edge of the switching substrate or an edge of the light-emitting substrate; and
- bonding the switching substrate and the light-emitting substrate with the frame glue to seal the light-emitting diode between the switching substrate and the light-emitting substrate.

In the substrate encapsulating method of the present application, the first underlay includes a first glass underlay and a first flexible underlay that are attached to each other, and the switching device is fabricated on the first flexible underlay;

the second underlay includes a second glass underlay and a second flexible underlay that are attached to each other, and the light-emitting diode is fabricated on the second flexible underlay; and after bonding the switching substrate and the light-emitting substrate with the frame glue, the method further includes:

- peeling the first glass underlay from the first flexible underlay and peeling the second glass underlay from the second flexible underlay.

In the substrate encapsulating method of the present application, bonding the switching substrate or the light-emitting substrate with the frame glue includes:

- aligning the switching substrate and the light-emitting substrate;
- evacuating the switching substrate and the light-emitting substrate using a vacuum device;
- pressure bonding the switching substrate and the light-emitting substrate with the frame glue; and
- breaking a vacuum state of the vacuum device, and taking out the switching substrate and the light-emitting substrate.

In the substrate encapsulating method of the present application, providing a second underlay and fabricating the light-emitting diode on the second underlay to form the light-emitting substrate further includes:

- bonding the light-emitting diode to the second underlay using an optical glue; and
- baking the light-emitting substrate at a high temperature to cure a layer of the optical glue.

In the substrate encapsulating method of the present application, the optical glue includes acrylic resin and at least one of unsaturated polyester, polyurethane, epoxy resin, and phenolic resin.

In the substrate encapsulating method of the present application, providing the first underlay and fabricating the switching device on the first underlay to form the switching substrate further includes:

- fabricating a welding terminal on the switching substrate, and connecting the welding terminal to the switching device;
- fabricating a welding layer on the welding terminal; and
- welding the light-emitting diode and the welding terminal via the welding layer.

In the substrate encapsulating method of the present application, providing the second underlay and fabricating the light-emitting diode on the second underlay to form the light-emitting substrate further includes:

- fabricating a welding electrode on the light-emitting diode; and
- where welding the light-emitting diode and the welding terminal via the welding layer includes:
  - welding the welding electrode to the welding terminal via the welding layer.

In the substrate encapsulating method of the present application, the welding layer is formed by a screen-printing process or an inkjet process.

In another aspect, the present application further provides a display panel, including:

- a switching substrate, on which a plurality of welding terminals are disposed;

a light-emitting substrate, arranged opposite to the switching substrate, a light-emitting diode is disposed on the light-emitting substrate, and the welding terminals are connected to the light-emitting diode; and a frame glue, hermetically connected to an edge between the switching substrate and the light-emitting substrate, and the light-emitting diode is sealed between the switching substrate and the light-emitting substrate.

In the display panel of the present application, a vacuum cavity is formed between the switching substrate, the light-emitting substrate, and the frame glue, and the light-emitting diode is located in the vacuum cavity.

In the display panel of the present application, a side of the light-emitting diode facing the switching substrate is disposed with a welding electrode, a side of the welding terminal facing the light-emitting substrate is disposed with a welding layer, and the welding electrode is connected to the welding layer.

In the display panel of the present application, the switching substrate includes a first underlay, a plurality of switching devices are disposed on the first underlay, the light-emitting substrate includes a second underlay, and the light-emitting diode is bonded on the second underlay by an optical glue.

In the display panel of the present application, the optical glue includes acrylic resin and at least one of unsaturated polyester, polyurethane, epoxy resin, and phenolic resin.

In the display panel of the present application, the light-emitting diode is disposed on a side facing the switching substrate, and a light source generated by the light-emitting diode is emitted from a side of the second underlay facing away from the switching substrate.

In the other aspect, the present application further provides a display device, including a display panel, and the display panel includes:

a switching substrate, on which a plurality of welding terminals are disposed;

a light-emitting substrate, arranged opposite to the switching substrate, a light-emitting diode is disposed on the light-emitting substrate, and the welding terminals are connected to the light-emitting diode; and a frame glue, hermetically connected to an edge between the switching substrate and the light-emitting substrate, and the light-emitting diode is sealed between the switching substrate and the light-emitting substrate.

In the display device of the present application, a vacuum cavity is formed between the switching substrate, the light-emitting substrate, and the frame glue, and the light-emitting diode is located in the vacuum cavity.

In the display device of the present application, a side of the light-emitting diode facing the switching substrate is disposed with a welding electrode, a side of the welding terminal facing the light-emitting substrate is disposed with a welding layer, and the welding electrode is connected to the welding layer.

In the display device of the present application, the switching substrate includes a first underlay, a plurality of switching devices are disposed on the first underlay, the light-emitting substrate includes a second underlay, and the light-emitting diode is bonded on the second underlay by an optical glue.

In the display device of the present application, the optical glue includes acrylic resin and at least one of unsaturated polyester, polyurethane, epoxy resin, and phenolic resin.

In the display device of the present application, the light-emitting diode is disposed on a side facing the switching substrate, and a light source generated by the light-emitting diode is emitted from a side of the second underlay facing away from the switching substrate.

The beneficial effect of the present application is: forming a light-emitting substrate by a switching substrate fabricated with switching devices and a light-emitting substrate fabricated with a light-emitting diode, coating frame glue on the edge of the switching substrate or the edge of the light-emitting substrate, and bonding the switching substrate and the light-emitting substrate by the frame glue, thereby sealing the light-emitting diode between the switching substrate and the light-emitting substrate. Compared with the encapsulating process using the encapsulation glue, due to the first underlay and the second underlay having higher hardness, uniform thickness, and high flatness, the encapsulation effect can be improved by realizing the sealing of light-emitting diodes via the combination of switching substrate and light-emitting substrate with the frame glue, which helps to avoid the problem of poor water and oxygen resistance caused by an uneven silicone film, improve the uniformity of the display, and also avoid the problem of low light transmittance caused by the uneven silicone film. It is beneficial to improve the light output efficiency of the display panel, thereby increasing the display brightness and reducing the power consumption.

BRIEF DESCRIPTION OF DRAWINGS

The technical solutions and other beneficial effects of the present application will be made obvious by describing the specific embodiments of the present application in detail below in conjunction with the accompanying drawings.

DETAILED DESCRIPTION OF EMBODIMENTS

The technical solutions in the embodiments of the present application will be clearly and completely described below in conjunction with the drawings in the embodiments of the present application. Obviously, the described embodiments are only a part of the embodiments of the present application, rather than all the embodiments. Based on the embodiments in the present application, all other embodiments obtained by those skilled in the art without creative work shall fall within the protection scope of the present application.

In the description of the present application, it should be understood that the terms “first” and “second” are only used for descriptive purposes, and cannot be understood as indicating or implying relative importance or implicitly indicating the number of technical features indicated. Therefore, the features defined with “first” and “second” may explicitly or implicitly include one or more of the features. In the description of the present application, “plurality” means two or more, unless otherwise specifically defined.

In the present application, unless expressly stipulated and defined otherwise, the first feature “on” or “under” the second feature may indicate that the first and second features are in direct contact, or may indicate the first and second features are not in direct contact but through other features between them. Moreover, the first feature "on", "upon" and "above" the second feature indicates that the first feature is directly above or obliquely above the second feature, or simply means that the first feature is higher in level than the second feature. The first feature "below", "under" and "beneath" the second feature indicates that the first feature is directly below or obliquely below the second feature, or simply means that the first feature is lower in level than the second feature.

The following disclosure provides many different embodiments or examples to realize the different structures of the present application. To simplify the disclosure of the present application, the components and settings of a specific example are described below. Obviously, they are only examples and are not intended to limit the present application.

The present application provides a substrate encapsulating method, a display panel, and a display device, which will be respectively introduced in detail below.

Figure 1:
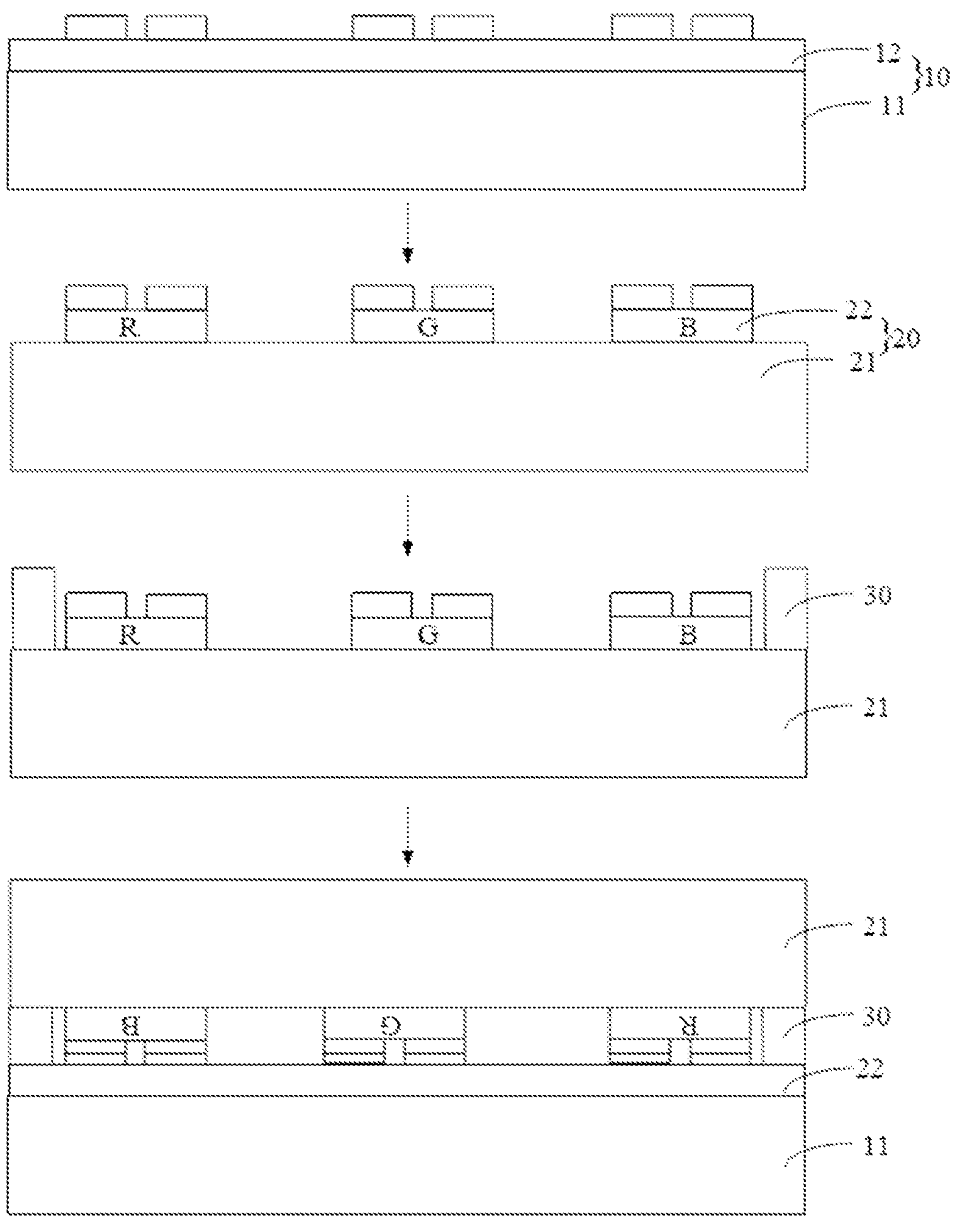
FIG. 1 is a process flow schematic diagram of a substrate encapsulating method provided by an embodiment of the application.
Figure 2:
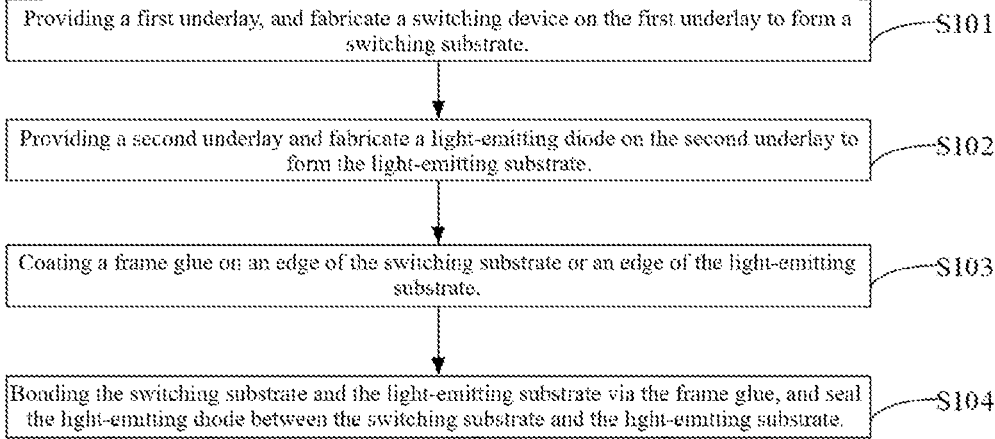
FIG. 2 is a schematic flowchart of a substrate encapsulating method provided by an embodiment of the application.
Figure 3:
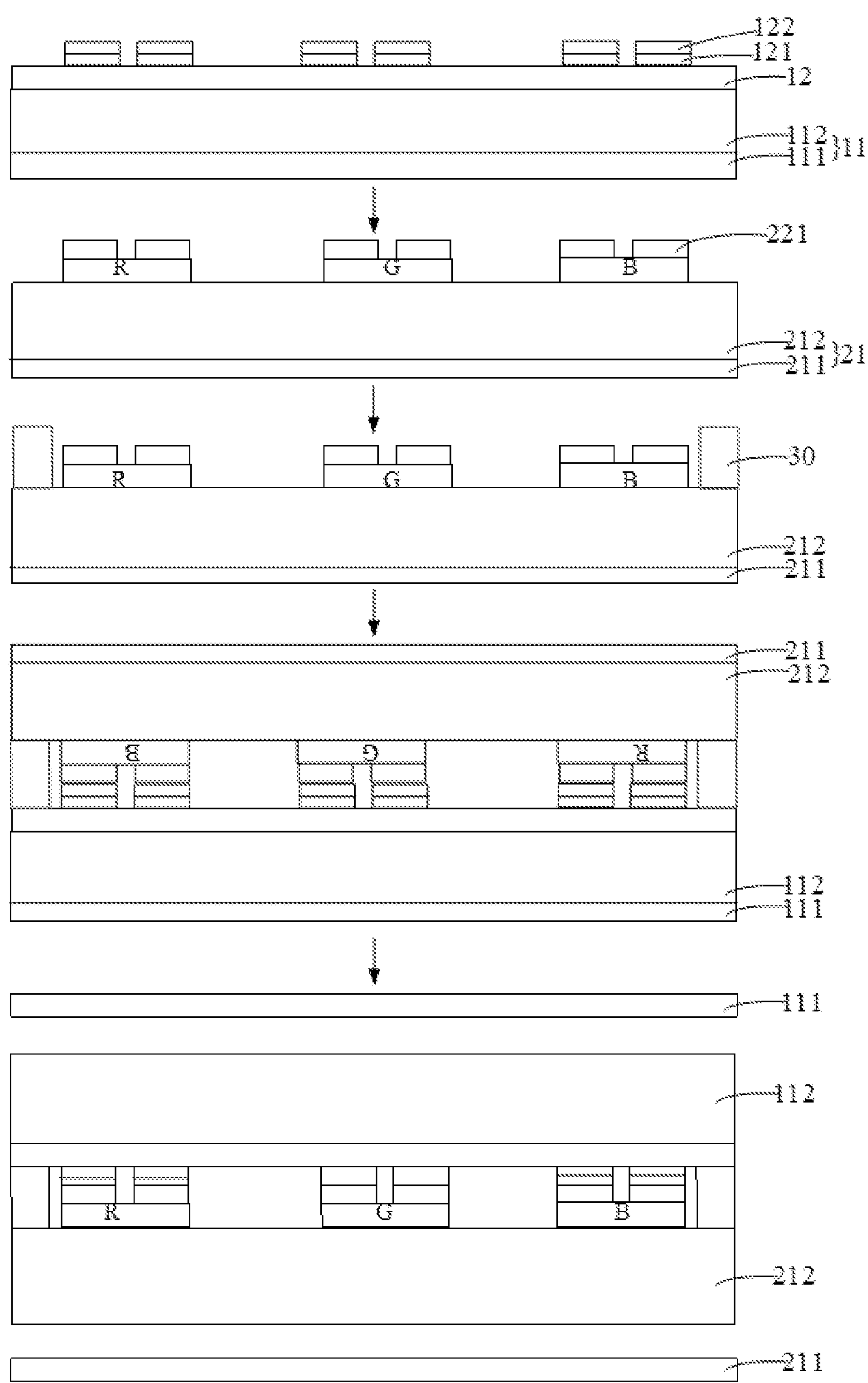
FIG. 3 is a process flow schematic diagram of another substrate encapsulating method provided by an embodiment of the application.

Please refer to FIGS. 1-3, the embodiment of the present application provides a substrate encapsulating method, including the following steps S101-S104

S101: Providing a first underlay 11, and fabricate a switching device 12 on the first underlay 11 to form a switching substrate 10.

The switching device 12 is a thin-film transistor (TFT), the thin-film transistor is arranged in an array on the first underlay 11, and the switching substrate 10 is a TFT substrate for driving and controlling a light-emitting substrate 20 to emit light.

S102: Providing a second underlay 21 and fabricate a light-emitting diode 22 on the second underlay 21 to form the light-emitting substrate 20.

The light-emitting diode 22 (LED) is a light-emitting device with a driving chip, and the light-emitting diode 22 at least includes a red LED, a green LED, and a blue LED arranged in an array in sequence.

The first underlay 11 and the second underlay 21 may be rigid underlays, such as glass underlays, quartz underlays, etc., or it may also be flexible underlays, such as polyimide (PI) underlays, etc. The thickness of the first underlay 11 or the second underlay 21 can be 0.2 mm-0.5 mm. For example, the second underlay 21 can be 0.2 mm, 0.3 mm, 0.5 mm, etc. Since the second underlay 21 is disposed with a light-emitting diode 22, a light can be emitted from the second underlay 21. By setting the thickness of the second underlay 21 within a reasonable range, it can prevent the second underlay 21 from being too thick and having a greater impact on the refractive index, which is beneficial to ensure the light transmission effect.

S103: Coating a frame glue 30 on an edge of the switching substrate 10 or an edge of the light-emitting substrate 20.

The frame glue 30 can be coated on the edge of the switching substrate 10 or the edge of the light-emitting substrate 20, both of which can realize the bonding between the two substrates.

S104: Bonding the switching substrate 10 and the light-emitting substrate 20 via the frame glue 30, and seal the light-emitting diode 22 between the switching substrate 10 and the light-emitting substrate 20.

Since the switching substrate 10 has the first underlay 11 and the light-emitting substrate 20 has the second underlay 21, the water and oxygen resistance can be improved.

The substrate encapsulating method of the embodiment of the present application is to form a switching substrate 10 fabricated with a switching device 12 and a light-emitting diode 22 fabricated to form a light-emitting substrate 20, coat a frame glue 30 on an edge of the switching substrate 10 or an edge of the light-emitting substrate 20, and bond the switching substrate 10 and the light-emitting substrate 20 via the frame glue 30, thereby sealing the light-emitting diode 22 between the switching substrate 10 and the light-emitting substrate 20. Compared with the encapsulating process using the encapsulation glue, due to the first underlay and the second underlay having high hardness, uniform thickness, and high flatness, the encapsulation effect can be improved by realizing the sealing of light-emitting diodes via the combination of switching substrate 10 and light-emitting substrate 20 with the frame glue, which helps to avoid the problem of poor water and oxygen resistance caused by an uneven silicone film layer, improving the uniformity of the display, and also avoid the problem of low light transmittance caused by an uneven silicone film layer. It is beneficial to improve the light output efficiency of the display panel, thereby increasing display brightness and reducing power consumption.

In some embodiments, taking the underlays of the switching substrate 10 and the light-emitting substrate 20 both as flexible underlays as an example, the first underlay 11 provided during manufacturing includes a first glass underlay 111 and a first flexible underlay 112 that are attached to each other, and the switching device 12 is fabricated on the first flexible underlay 112. The second underlay 21 provided includes a second glass underlay 211 and a second flexible underlay 212 that are attached to each other, and the light-emitting diode 22 is fabricated on the second flexible underlay 212.

As shown in FIG. 3, after the switching substrate 10 or the light-emitting substrate 20 is aligned and bonded with the frame glue 30 in step S104, the following step S105 is further included:

S105: Peeling the first glass underlay 111 from the first flexible underlay 112 and peel the second glass underlay 211 from the second flexible underlay 212.

Since the flexible underlay is used to realize the bonding of the switching substrate 10 and the light-emitting substrate 20, the lack of rigidity may cause misalignment of the LED chip during alignment. Therefore, the glass underlay is first attached to the flexible underlay to provide sufficient rigidity. After the alignment and attaching are completed, the glass underlay is peeled off, thereby improving the accuracy of the substrate alignment, which is beneficial to improve production yields.

In some embodiments, the step S104 of aligning the switching substrate 10 or the light-emitting substrate 20 and bonding via the frame glue 30 includes the following steps S401 to S404.

S401: Aligning the switching substrate 10 and the light-emitting substrate 20.

S402: Evacuating the switching substrate 10 and the light-emitting substrate 20 using a vacuum device.

S403: Pressure bonding the switching substrate 10 and the light-emitting substrate 20 with the frame glue 30.

S404: Breaking a vacuum state of the vacuum device, and take out the switching substrate 10 and the light-emitting substrate 20.

After aligning the switching substrate 10 and the light-emitting substrate 20, evacuating is performed so that a vacuum cavity 201 is formed between the light-emitting substrate 20, the switching substrate 10, and the frame glue 30, thereby preventing the light-emitting diode 22 and the switching device 12 from contacting with water and oxygen in the air, which further improves water and oxygen resistance of the packaged substrate, which is beneficial to prolong the service life.

In some embodiments, the step S102 of providing the second underlay 21, and fabricating the light-emitting diode 22 on the second underlay 21 to form the light-emitting substrate 20 further includes steps S201-S202.

S201: Bonding the light-emitting diode 22 on the second underlay 21 using an optical glue (not shown in the figure).

S202: Baking the light-emitting substrate 20 at a high temperature to cure an optical glue layer.

The optical glue is colorless and transparent, has a high light transmittance and a small shrinkage after high temperature curing, and after curing, a crosslinking reaction occurs, and the viscosity increases. The optical glue can be, for example, acrylic resin and unsaturated polyester, polyurethane, epoxy resin, phenolic resin, etc. The temperature and time parameters of high-temperature baking and curing can be selected differently according to different optical glue materials. Generally speaking, the higher the temperature, the shorter the baking time. Specifically, the temperature range of high-temperature baking may be 80° C. to 180° C., and the time range may be 5 minutes to 2 hours.

Illustratively, taking the optical glue using the phenolic resin as an example, when the baking and curing temperature of the phenolic resin is 180° C., the baking time is 2 hours, and when the baking temperature of the epoxy resin is 120° C., the baking time is 10 minutes. Taking the optical glue using the epoxy resin as an example, when the curing temperature of the epoxy resin is 80° C., the baking time can be 30 minutes. Taking the optical glue using the polyurethane as an example, the parameters for high-temperature curing can be a temperature of 110° C. and a baking time of 6 minutes.

In some embodiments, the step S101 of providing the first underlay 11 and fabricating the switching device 12 on the first underlay 11 to form the switching substrate 10 further includes the following steps S11-S13.

S11: Fabricating welding terminals 121 on the switching substrate 10, and the welding terminals 121 are connected to the switching device 12.

S12: Fabricating welding layers 122 on the welding terminals 121. The welding layers 122 can be formed using a screen-printing process or an inkjet process.

S13: Welding the light-emitting diode 22 and the welding terminals 121 via the welding layers 122.

In some embodiments, the step S102 of providing the second underlay 21 and fabricating the light-emitting diode 22 on the second underlay 21 to form the light-emitting substrate 20 further includes:

S203: Fabricating welding electrodes 221 on the light-emitting diode 22. The welding electrode 221 includes a positive electrode and a negative electrode arranged at intervals.

The step S13 of welding the light-emitting diode and the welding terminal via the welding layer includes:

S131: Welding the welding electrodes 221 to the welding terminals 121 via the welding layers 122.

Figure 4:
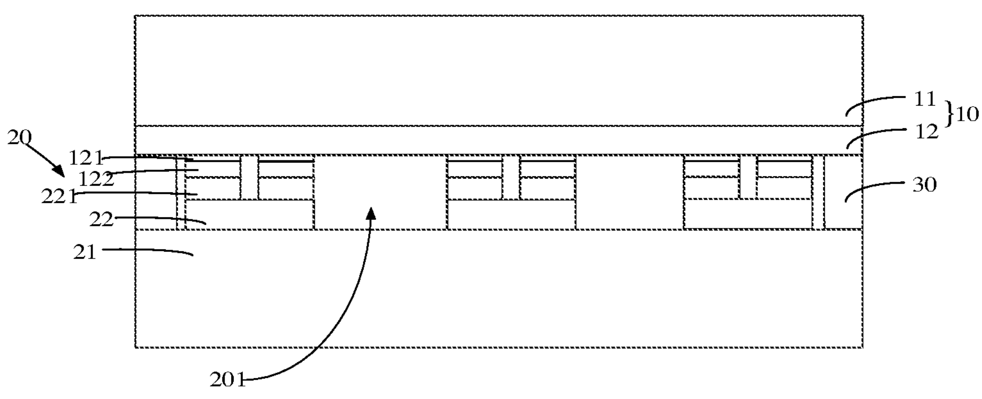
FIG. 4 is a schematic structural diagram of a display panel provided by an embodiment of the application.

Please refer to FIG. 4, to better implement the substrate encapsulating method of the present application, the embodiment of the present application further includes a display panel, which includes a switching substrate 10, a light-emitting substrate 20, and a frame glue 30.

A plurality of welding terminals 121 are disposed on the switching substrate 10. The switching substrate 10 includes a first underlay 11 and a switching device 12, and the switching device 12 is disposed on the first underlay 11.

The light-emitting substrate 20 is disposed opposite to the switching substrate 10, and the light-emitting substrate 20 includes a second underlay 21 and a light-emitting diode 22. The light-emitting diode 22 is disposed on the light-emitting substrate 20, the welding terminals 121 are connected to the light-emitting diode 22, and the light-emitting diode 22 is disposed on the second underlay 21. Specifically, the light-emitting diode 22 is disposed on a side facing the switching substrate 10, and the light source generated by the light-emitting diode 22 is emitted from a side of the second underlay 21 facing away from the switching substrate 10.

The frame glue 30 is hermetically connected to an edge between the switching substrate 10 and the light-emitting substrate 20, and the light-emitting diode 22 is sealed between the switching substrate 10 and the light-emitting substrate 20.

The substrate encapsulating method of the embodiment of the present application is to form a switching substrate 10 fabricated with a switching device 12 and a light-emitting diode 22 fabricated to form a light-emitting substrate 20, coat the frame glue 30 on an edge of the switching substrate 10 or an edge of the light-emitting substrate 20, and bonds the switching substrate 10 and the light-emitting substrate 20 via the frame glue 30, thereby sealing the light-emitting diode 22 between the switching substrate 10 and the light-emitting substrate 20. Compared with the encapsulating process using the encapsulation glue, due to the first underlay and the second underlay having high hardness, uniform thickness, and high flatness, the encapsulation effect can be improved by realizing the sealing of light-emitting diodes via the combination of switching substrate 10 and light-emitting substrate 20 with the frame glue, which helps to avoid the problem of poor water and oxygen resistance caused by an uneven silicone film layer, improving the uniformity of the display, and also avoid the problem of low light transmittance caused by an uneven silicone film layer. It is beneficial to improve the light output efficiency of the display panel, thereby increasing display brightness and reducing power consumption.

In some embodiments, a vacuum cavity 201 is formed between the switching substrate 10, the light-emitting substrate 20 and the frame glue 30, and the light-emitting diode 22 is located in the vacuum cavity 201. After aligning the switching substrate 10 and the light-emitting substrate 20, evacuating is performed so that a vacuum cavity 201 is formed between the light-emitting substrate 20, the switching substrate 10, and the frame glue 30, thereby preventing the light-emitting diode 22 and the switching device 12 from contacting with water and oxygen in the air, which further improves water and oxygen resistance of the packaged substrate, which is beneficial to prolong the service life.

In some embodiments, a side of the light-emitting diode 22 facing the switching substrate 10 is disposed with welding electrodes 221, a side of the welding terminals 121 facing the light-emitting substrate 20 is disposed with welding layers 122, and the welding electrodes 221 and the welding layers 122 are connected. The material of the welding layers 122 can be silver paste or solder paste, and welding through the welding layers 122 can improve the stability of the connection between the light-emitting diode 22 and the switching substrate 10.

The present application also provides a display device, which includes the display panel. Since the display device has the above-mentioned display panel, it has all the same beneficial effects, which will not be repeated here in this embodiment. The embodiment of the present application does not specifically limit the application of the display device, which can be a TV, a laptop, a tablet computer, a wearable display device (such as a smart bracelet, a smartwatch, etc.), a mobile phone, a virtual reality device, an augmented reality device, a vehicle display, an advertising lightbox, and any product or component with display function.

In the above-mentioned embodiments, the description of each embodiment has its own emphasis. For parts that are not described in detail in one embodiment, reference may be made to related descriptions of other embodiments.

When implementing, each of the above units or structures can be implemented as independent entities, or can be combined arbitrarily and implemented as the same or several entities. For the specific implementation of each of the above units or structures, please refer to the previous method embodiments, which will not be repeated here.

The above is a detailed introduction to the substrate encapsulating method, the display panel, and the display device provided by the embodiments of the present application. Specific examples are used in this article to illustrate the principle and implementation of the embodiments of the present application. The description of the embodiments is only used to help understand the technical solutions and core ideas of the embodiments of the present application. Those of ordinary skill in the art should understand that they can still modify the technical solutions recorded in the aforementioned embodiments or equivalently replace part of the technical features. These modifications or replacements do not cause the essence of the corresponding technical solutions to deviate from the scope of the technical solutions in the various embodiments of the present application.

What is claimed is:

1. A substrate encapsulating method, comprising:

providing a first underlay, and fabricating a switching device on the first underlay to form a switching substrate;

providing a second underlay, and fabricating a light-emitting diode on the second underlay to form a light-emitting substrate;

applying a frame glue to an edge of the switching substrate or an edge of the light-emitting substrate; and bonding the switching substrate and the light-emitting substrate with the frame glue to seal the light-emitting diode between the switching substrate and the light-emitting substrate;

wherein the first underlay comprises a first glass underlay and a first flexible underlay that are attached to each other, and the switching device is fabricated on the first flexible underlay;

the second underlay comprises a second glass underlay and a second flexible underlay that are attached to each other, and the light-emitting diode is fabricated on the second flexible underlay; and after the step of bonding the switching substrate and the light-emitting substrate with the frame glue, the method further comprises:

peeling the first glass underlay from the first flexible underlay and peeling the second glass underlay from the second flexible underlay.

2. The substrate encapsulating method according to claim 1, wherein bonding the switching substrate and the light-emitting substrate with the frame glue comprises:

aligning the switching substrate and the light-emitting substrate;

evacuating the switching substrate and the light-emitting substrate using a vacuum device;

pressure bonding the switching substrate and the light-emitting substrate with the frame glue; and breaking a vacuum state of the vacuum device, and taking out the switching substrate and the light-emitting substrate.

3. The substrate encapsulating method according to claim 1, wherein the step of providing the second underlay and fabricating the light-emitting diode on the second underlay to form the light-emitting substrate, the method further comprises:

bonding the light-emitting diode to the second underlay using an optical glue; and baking the light-emitting substrate at a high temperature to cure a layer of the optical glue.

4. The substrate encapsulating method according to claim 3, wherein the optical glue comprises acrylic resin and at least one of unsaturated polyester, polyurethane, epoxy resin, and phenolic resin.

5. The substrate encapsulating method according to claim 1, wherein providing the first underlay and fabricating the switching device on the first underlay to form the switching substrate further comprises:

fabricating a welding terminal on the switching substrate, and connecting the welding terminal to the switching device;

fabricating a welding layer on the welding terminal; and welding the light-emitting diode and the welding terminal via the welding layer.

6. The substrate encapsulating method according to claim 5, wherein providing the second underlay and fabricating the light-emitting diode on the second underlay to form the light-emitting substrate further comprises:

fabricating a welding electrode on the light-emitting diode; and wherein welding the light-emitting diode and the welding terminal via the welding layer comprises:

welding the welding electrode to the welding terminal via the welding layer.

7. The substrate encapsulating method according to claim 5, wherein the welding layer is formed by a screen-printing process or an inkjet process.

8. A display panel, comprising:

a switching substrate, on which a plurality of welding terminals are disposed;

a light-emitting substrate, arranged opposite to the switching substrate, a light-emitting diode is disposed on the light-emitting substrate, and the welding terminals are connected to the light-emitting diode; and a frame glue, hermetically connected to an edge between the switching substrate and the light-emitting substrate, and the light-emitting diode is sealed between the switching substrate and the light-emitting substrate;

wherein the switching substrate comprises a first underlay, a plurality of switching devices are disposed on the first underlay, the light-emitting substrate comprises a second underlay, and the light-emitting diode is bonded on the second underlay by an optical glue.

9. The display panel according to claim 8, wherein a vacuum cavity is formed between the switching substrate, the light-emitting substrate, and the frame glue, and the light-emitting diode is located in the vacuum cavity.

10. The display panel according to claim 8, wherein a side of the light-emitting diode facing the switching substrate is disposed with a welding electrode, a side of the welding terminal facing the light-emitting substrate is disposed with a welding layer, and the welding electrode is connected to the welding layer.

11. The display panel according to claim 8, wherein the optical glue comprises acrylic resin and at least one of unsaturated polyester, polyurethane, epoxy resin, and phenolic resin.

12. The display panel according to claim 8, wherein the light-emitting diode is disposed on a side facing the switching substrate, and a light source generated by the light-emitting diode is emitted from a side of the second underlay facing away from the switching substrate.

13. A display device, comprising a display panel, and the display panel comprises:

a switching substrate, on which a plurality of welding terminals are disposed;

a light-emitting substrate, arranged opposite to the switching substrate, a light-emitting diode is disposed on the light-emitting substrate, and the welding terminals are connected to the light-emitting diode; and a frame glue, hermetically connected to an edge between the switching substrate and the light-emitting substrate, and the light-emitting diode is sealed between the switching substrate and the light-emitting substrate;

wherein the switching substrate comprises a first underlay, a plurality of switching devices are disposed on the first underlay, the light-emitting substrate comprises a second underlay, and the light-emitting diode is bonded on the second underlay by an optical glue.

14. The display device according to claim 13, wherein a vacuum cavity is formed between the switching substrate, the light-emitting substrate, and the frame glue, and the light-emitting diode is located in the vacuum cavity.

15. The display device according to claim 13, wherein a side of the light-emitting diode facing the switching substrate is disposed with a welding electrode, a side of the welding terminal facing the light-emitting substrate is disposed with a welding layer, and the welding electrode is connected to the welding layer.

16. The display device according to claim 13, wherein the optical glue comprises acrylic resin and at least one of unsaturated polyester, polyurethane, epoxy resin, and phenolic resin.

17. The display device according to claim 13, wherein the light-emitting diode is disposed on a side facing the switching substrate, and a light source generated by the light-emitting diode is emitted from a side of the second underlay facing away from the switching substrate.

* * * * *